United States Patent
Chen et al.

(10) Patent No.: US 7,897,988 B2
(45) Date of Patent: Mar. 1, 2011

(54) ELECTROLUMINESCENT DEVICE

(75) Inventors: Shih-Peng Chen, Taoyuan Hsien (TW); Ching-Chuan Shiue, Taoyuan Hsien (TW); Hsueh-Kuo Liao, Taoyuan Hsien (TW); Chuan-Chia Cheng, Taoyuan Hsien (TW); Huang-Kun Chen, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 12/473,072

(22) Filed: May 27, 2009

(65) Prior Publication Data

US 2009/0294790 A1 Dec. 3, 2009

Related U.S. Application Data

(62) Division of application No. 11/941,807, filed on Nov. 16, 2007, now Pat. No. 7,625,769.

(30) Foreign Application Priority Data

Dec. 18, 2006 (TW) .............................. 95147369 A

(51) Int. Cl.
*H01L 33/00* (2010.01)
(52) U.S. Cl. .............................. 257/98; 257/91; 257/99; 438/16; 438/29
(58) Field of Classification Search .................. 257/91, 257/98, 99, E33.001; 438/16, 22, 29
See application file for complete search history.

(56) References Cited

U.S. PATENT DOCUMENTS

| | | | |
|---|---|---|---|
| 7,012,281 B2 | 3/2006 | Tsai et al. | |
| 7,087,922 B2 * | 8/2006 | Wu et al. | 257/13 |
| 7,197,203 B2 * | 3/2007 | Koyama | 385/14 |
| 7,282,741 B2 * | 10/2007 | Kim et al. | 257/79 |
| 7,384,808 B2 * | 6/2008 | Liu et al. | 438/29 |
| 2005/0062051 A1 | 3/2005 | Kwak et al. | |
| 2006/0141267 A1 * | 6/2006 | Okura et al. | 428/432 |
| 2007/0010035 A1 * | 1/2007 | Liu et al. | 438/22 |
| 2007/0175508 A1 * | 8/2007 | Park | 136/256 |
| 2008/0006842 A1 | 1/2008 | Seong et al. | |

* cited by examiner

*Primary Examiner*—Phuc T Dang
(74) *Attorney, Agent, or Firm*—Birch, Stewart, Kolasch & Birch, LLP

(57) ABSTRACT

An electroluminescent device includes a conduction substrate, a reflection layer, a patterned transparent conduction layer, at least one light emitting diode (LED) element, a first contact electrode and a second contact electrode. The reflection layer is disposed on the conduction substrate, and the patterned transparent conduction layer is formed on the reflection layer. The LED element is formed on the patterned transparent conduction layer, and the LED element includes a first semiconductor layer, a light emitting layer and a second semiconductor layer in sequence. The second semiconductor layer is disposed on the patterned transparent conduction layer and the reflection layer. The first contact electrode is disposed at one side of the first semiconductor layer, and the second contact electrode is disposed at one side of the conduction substrate.

11 Claims, 8 Drawing Sheets

ELECTROLUMINESCENT DEVICE

CROSS REFERENCE TO RELATED APPLICATIONS

This application is a Divisional of application Ser. No. 11/941,807 filed Nov. 16, 2007, now U.S. Pat. No. 7,625,769, and for which priority is claimed under 35 U.S.C. 120; and this application claims priority of application Ser. No. 095147369, filed in Taiwan, Republic of China on Dec. 18, 2006, the entire contents of which are hereby incorporated by reference.

BACKGROUND OF THE PRESENT INVENTION

1. Field of Invention

The present invention relates to an electroluminescent device and a fabrication method thereof, and more particularly to an electroluminescent device and a fabrication method thereof with high efficiency.

2. Related Art

The light emitting diode (LED) is a cold light emitting element, which releases lights when energy released after electrons and holes are combined in a semiconductor material. According to different used materials, various monochromatic lights with different wavelengths are outputted. The LEDs may be mainly classified into a visible light LED and an invisible light (infrared) LED. Compared with the conventional lighting manner of a light bulb or lamp, the LED has advantages of power save, vibration resist, and high flicker speed, so that the LED has become an indispensable and important element in the daily life.

With reference to FIG. 1, a conventional LED device 1 is made by at least one LED element 10 attached to a transparent substrate 11. The LED element 10 includes a n-type semiconductor layer 101, a light emitting layer 102 and a p-type semiconductor layer 103 formed in sequence. A first contact electrode 104 is connected with the n-type semiconductor layer 101. A second contact electrode 105 is connected with the p-type semiconductor layer 103. When voltages are respectively applied to the semiconductor layers 101 and 103 to generate currents, the electrons and the holes of the n-type semiconductor layer 101 and the p-type semiconductor layer 103 are combined together so that electric power is converted into optical energy. As shown in FIG. 1, the LED element 10 is attached to the transparent substrate 11 by a transparent adhering layer 12. To raise the current distribution efficiency, the junction surface between the LED element 10 and the transparent adhering layer 12 further uses a transparent conduction layer 13. The overall brightness of the LED device 1 is increased by evenly distributing the current.

As shown in FIG. 1, the first contact electrode 104 is formed on the n-type semiconductor layer 101. The second contact electrode 105 is formed on the transparent conduction layer 13. That is, the first contact electrode 104 and the second contact electrode 105 are disposed at the same side of the transparent substrate 11. Therefore, the production of the LED device must involve the process of removing part of the LED element 10 by etching, for example, the area A in FIG. 1 is used for disposition of the second contact electrode 105. However, in addition to increase the complexity of the production process, this step may cause a leakage current of the LED element 10 due to its uneven surface as a result of the bad control in etching. This will lower the yield of the LED device 1.

In the prior art, it is common to utilize the epitaxial substrate as the transparent substrate and utilize an organic adhering material to form the transparent adhering layer. Since the epitaxial substrate and the organic adhering material have low thermal conductivity coefficients, they cannot provide a better heat dissipation path for the LED element 10. As a result, the heat generated from the operating LED device 1 accumulates and affects the light emitting efficiency thereof.

Current researches in the LED put emphases on how to extract the photons generated from the LED element 10 in order to reduce the unnecessary heat caused by repeated reflections and absorptions of the photons therein. It is thus important to lower the operating temperature of the LED device 1 in order to dissipate heat generated from the LED element 10.

SUMMARY OF THE PRESENT INVENTION

The present invention provides an electroluminescent device and a fabrication method thereof that involve simple production processes, possess a uniform electrical current distribution, and are capable of reducing heat accumulation.

A fabrication method of an electroluminescent device according to the present invention includes the steps of: providing a plate; forming at least one light emitting diode (LED) element on the plate, wherein the LED element includes a first semiconductor layer, a light emitting layer and a second semiconductor layer in sequence formed on the plate; forming a patterned transparent conduction layer on the LED element; forming a reflection layer on the patterned transparent conduction layer; attaching a conduction substrate to the reflection layer; removing the plate; and forming a first contact electrode and a second contact electrode at one side of the first semiconductor layer and one side of the conduction substrate, respectively.

An electroluminescent device according to the present invention includes a conduction substrate, a reflection layer, a patterned transparent conduction layer, at least one light emitting diode (LED) element, a first contact electrode and a second contact electrode. The reflection layer is disposed on the conduction substrate. The patterned transparent conduction layer is formed on the reflection layer. The LED element is formed on the patterned transparent conduction layer, the LED element includes a first semiconductor layer, a light emitting layer and a second semiconductor layer in sequence, and the second semiconductor layer is located on the patterned transparent conduction layer and the reflection layer. The first contact electrode is disposed at one side of the first semiconductor layer. The second contact electrode is disposed at one side of the conduction substrate.

An electrode substrate according to the present invention includes a conduction substrate, a reflection layer, a patterned transparent conduction layer and a contact electrode. The reflection layer is disposed on the conduction substrate. The patterned transparent conduction layer is formed on the reflection layer. The contact electrode is disposed at one side of the conduction substrate.

As mentioned above, an electroluminescent device and a fabrication method thereof according to the present invention utilize a conduction substrate that connects the contact electrodes of the LED element disposed at opposite sides of the conduction substrate. In comparison with the prior art, because the etching process is avoided, the production processes are thus simplified and the yield is raised. In addition, the patterned transparent conduction layer with a plurality of island-like structures is formed by for example the etching method so that the electrical current imposed to the LED element can be uniformly distributed so as to prevent current clogging. Moreover, the deposition of the reflection layer has a good ohmic contact with the patterned transparent conduction layer and provides a scattering and reflection interface. It effectively raises external light extraction and light emitting efficiency. Also, since the conduction substrate and the reflection layer are highly thermally conductive, the heat generated from the LED element can be more effectively dissipated than the prior art.

BRIEF DESCRIPTION OF THE DRAWINGS

The present invention will become more fully understood from the detailed description given herein below illustration only, and thus is not limitative of the present invention, and wherein.

DETAILED DESCRIPTION OF THE PRESENT INVENTION

Figure 1:
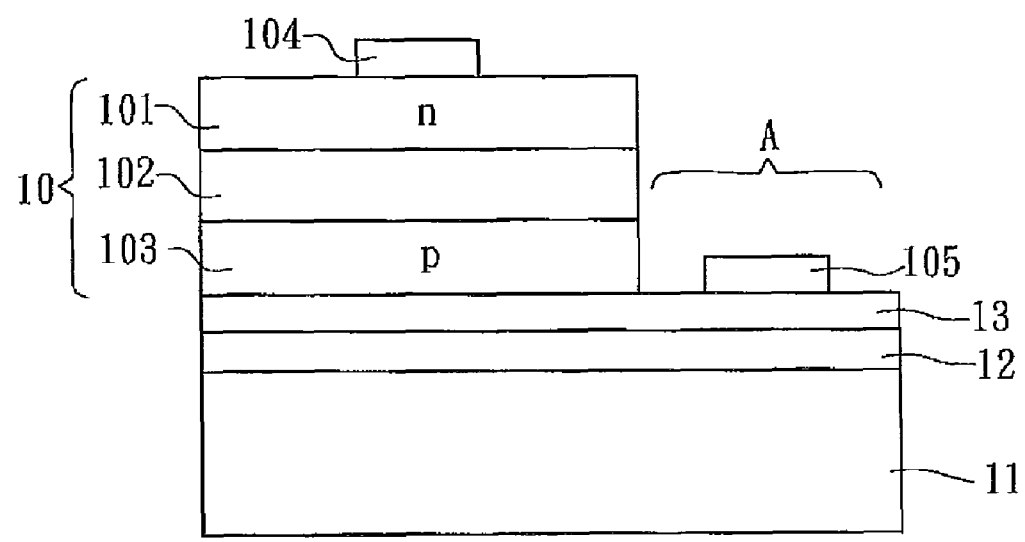
FIG. 1 is a schematic diagram showing a conventional LED device.

The present invention will be apparent from the following detailed description, which proceeds with reference to the accompanying drawings, wherein the same references relate to the same elements.

Please refer to FIGS. 2A, 2B, 3A and 3B. An electroluminescent device 2 according to a preferred embodiment of the present invention includes a conduction substrate 21, a reflection layer 22, a patterned transparent conduction layer 23, at least one light emitting diode (LED) element 24, a first contact electrode 25 and a second contact electrode 26.

In this embodiment, the conduction substrate 21 can be made of a semiconductor material or a metal that having a high coefficient of thermal conductivity. The semiconductor material is selected from the group consisting of Si, GaAs, GaP, SiC, BN and their combinations. The metal is selected from the group consisting of Al, Cu, Ag, Au, Ni and their combinations.

Figure 2A:
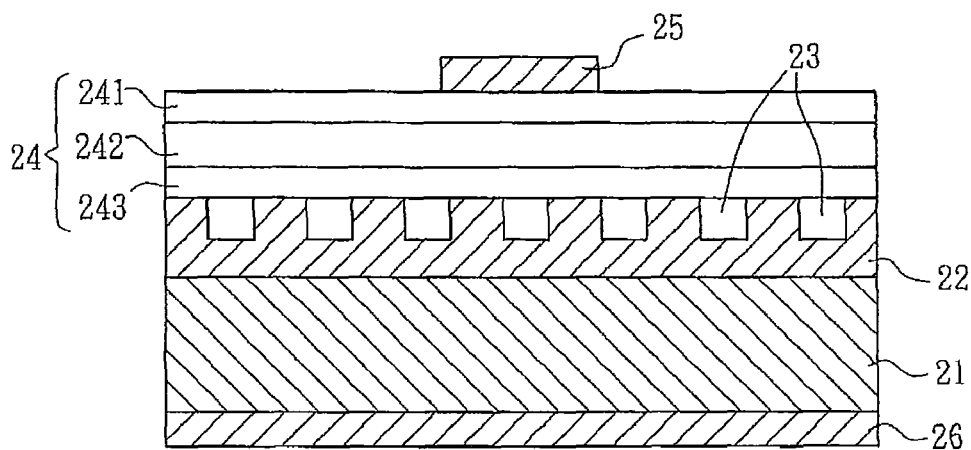
FIGS. 2A to 5B are a set of schematic diagrams showing an electroluminescent device according to a preferred embodiment of the present invention.
Figure 2B:
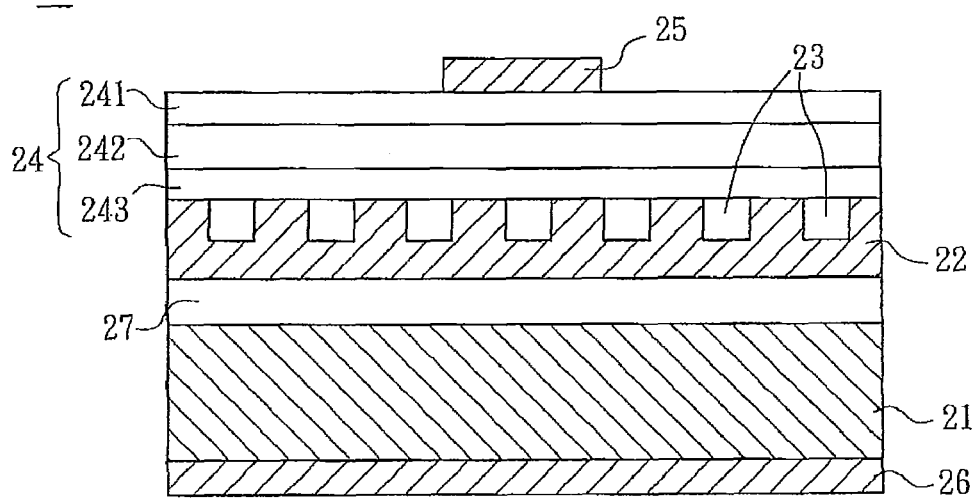
Figure 3A:
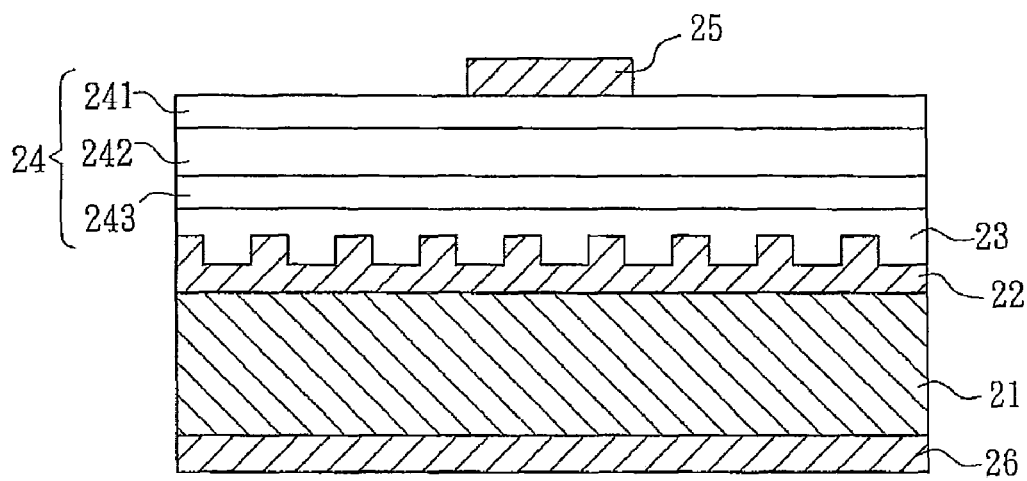
Figure 3B:
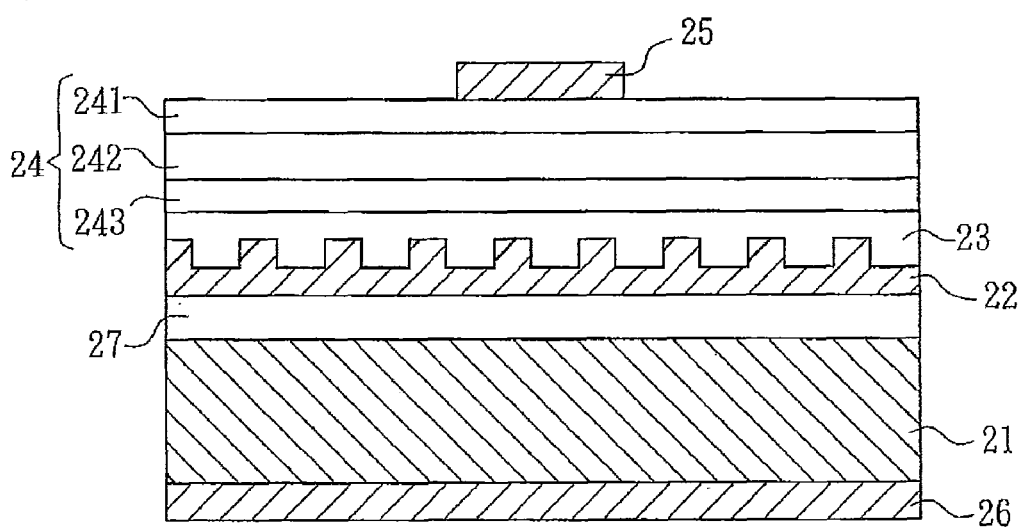

The reflection layer 22 is formed on the conduction substrate 21. The patterned transparent conduction layer 23 is formed on the reflection layer 22. As shown in FIGS. 2A to 3B, the reflection layer 22 has an uneven surface. The patterned transparent conduction layer 23 is filled with the concave parts of the reflection layer 22 so that the patterned transparent conduction layer 23 includes a plurality of island-like structures being independent or continuous. That is, the island-like structures can be separate (as shown in FIG. 2A) or connected (as shown in FIG. 3A). Of course, the patterned transparent conduction layer 23 can be a combination of the above-mentioned two island-like structures. The cross section of the island-like structure can be rectangular, circular, polygonal or irregular.

In this embodiment, the reflection layer 22 is made of a metal with high reflectivity. Along with the uneven surface, the reflection layer 22 provides good reflecting and scattering effects to enhance external light extraction. The metal of the reflection layer 22 is selected from the group consisting of Pt, Au, Ag, Cr, Ni, Pd, Ti, Al and their combinations. Besides, the reflection layer 22 and the patterned transparent conduction layer 23 are connected to form a good ohmic contact, thereby lowering its resistance and raising the light emitting efficiency of the electroluminescent device 2.

The LED element 24 is formed on the patterned transparent conduction layer 23. The LED element 24 includes a first semiconductor layer 241, a light emitting layer 242 and a second semiconductor layer 243. These layers are formed in the order of the second semiconductor 243, the light emitting layer 242 and the first semiconductor layer 241 on the patterned transparent conduction layer 23 and the reflection layer 22. In this embodiment, the LED element 24 can be formed on the patterned transparent conduction layer 23 with independent island-like structures. In this case, the second semiconductor layer 243 is in contact with the patterned transparent conduction layer 23 and the reflection layer 22 (as shown in FIG. 2A). Besides, the LED element 24 can also be formed on the patterned transparent conduction layer 23 with continuous island-like structures. In this case, the second semiconductor layer 243 is in contact with the patterned transparent conduction layer 23 (as shown in FIG. 3A). The patterned transparent conduction layer 23 thus achieves a uniform electrical current distribution in the LED element 24 so as to prevent the possibility of current clogging.

In this embodiment, the first semiconductor layer 241 can be an n-type semiconductor layer and the second semiconductor layer 243 can be a p-type semiconductor layer. However, this is only an example and the present invention is not restricted to this embodiment. Whether the first semiconductor layer 241 and the second semiconductor layer 243 are n-type and p-type semiconductor layers or the other way around depends upon the practical requirement.

The first contact electrode 25 is disposed at one side of the first semiconductor layer 241. The second contact electrode 26 is disposed at one side of the conduction substrate 21. That is, the first contact electrode 25 and the second contact electrode 26 are disposed at opposite sides of the conduction substrate 21, which forming an electroluminescent device with a perpendicular structure. Thereby, the present invention can avoid the etching process for disposing contact electrodes at the same side. This simplifies the production process and raises the yield.

Figure 4A:
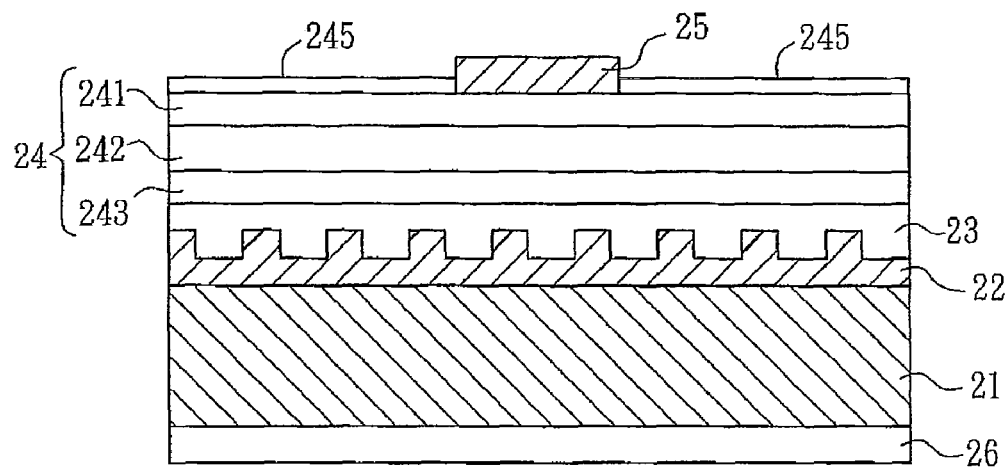

Please refer to FIG. 4A. In addition to the first contact electrode 25 is formed on the first semiconductor layer 241, the first semiconductor layer 241 can further form with a rough structure or an anti-reflection layer 245 on a light-emitting surface of the LED element 24 for guiding the light out. That is, the rough structure or the anti-reflection layer 245 is formed at the side of the first semiconductor layer 241 and on a position without the first contact electrode 25 so that the light emitting efficiency is effectively raised.

Figure 4B:
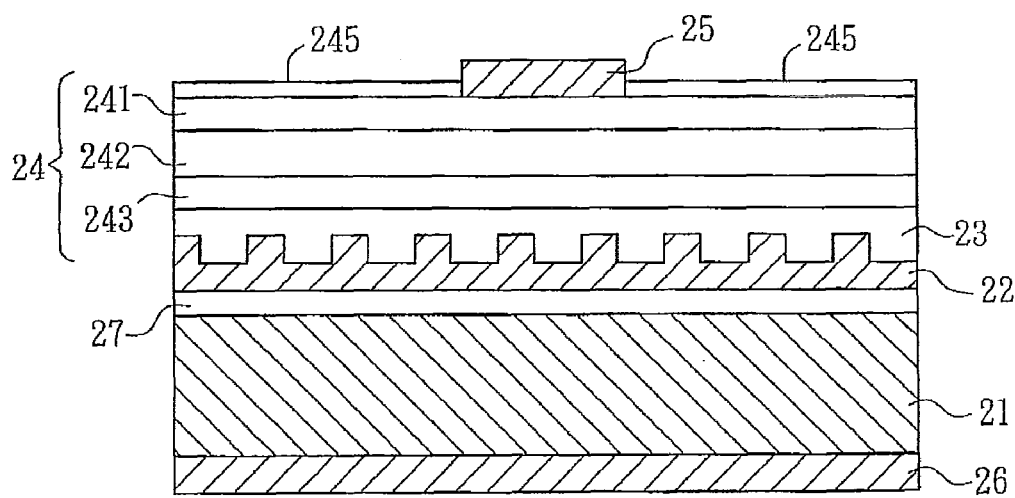
Figure 5A:
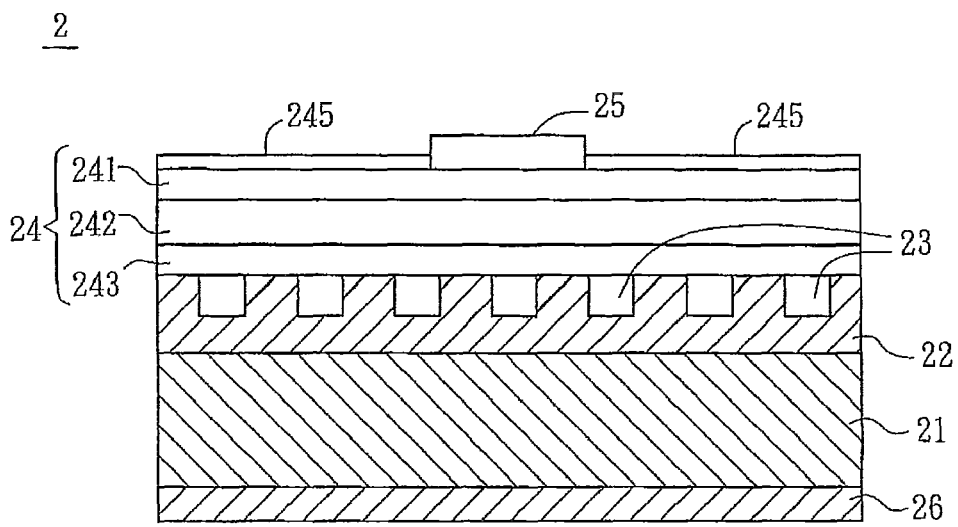
Figure 5B:
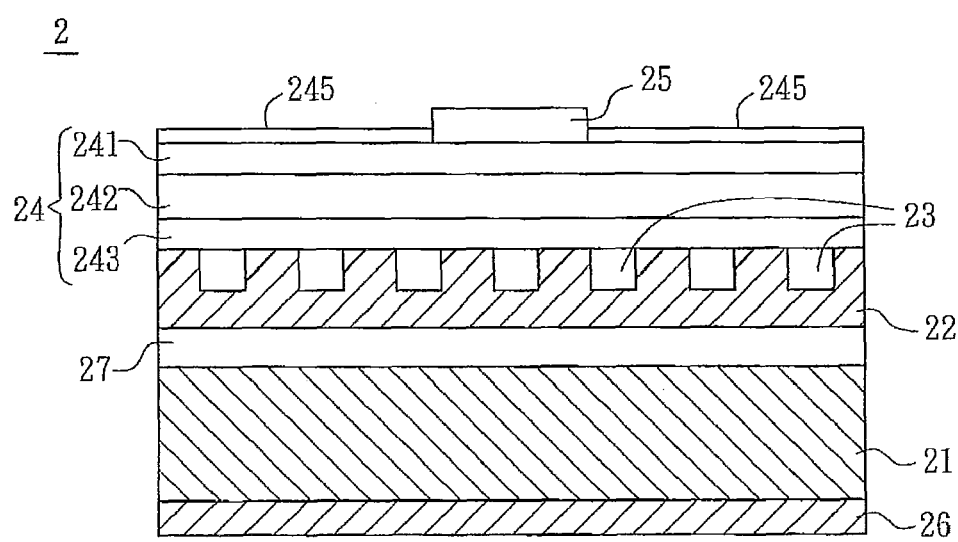

As shown in FIG. 4B, the electroluminescent device 2 can further include an adhering layer 27 disposed between the reflection layer 22 and the conduction substrate 21. The adhering layer 27 is highly thermally conductive and the adhering layer 27 may serve as a bonding layer. The material of the adhering layer 27 is silver paste, tin paste, tin-silver paste, a eutectic bonding material, metal or a conductive adhering material, which is a material containing lead or containing no lead. Since the coefficient of thermal conductivity of the adhering layer 27 in this embodiment is higher than that of the organic adhering material in the prior art, it can more effectively dissipate heat.

As described above, the electroluminescent device 2 utilizes the adhering layer 27 and the conduction substrate 21 that having high thermal conductivity coefficients to fully lower the operating temperature of the LED element 24.

Moreover, it has the advantages of capable of carrying a large current and suitable for making a large-area device. Thus, overall light emitting efficiency is greatly raised.

In addition to the structures of direct contact between the conduction substrate 21 and the reflection layer 22 shown in FIGS. 2A, 3A, 4A and 5A, an adhering layer 27 with high thermal conductivity can be inserted therebetween (as shown in FIGS. 2B, 3B, 4B and 5B). The material of the adhering layer 27 is silver paste, tin paste, tin-silver paste, a eutectic bonding material, metal or a conductive adhering material, which is a material containing lead or containing no lead. Since the coefficient of thermal conductivity of the adhering layer 27 in this embodiment is higher than that of the organic adhering material in the prior art, it can more effectively dissipate heat.

Figure 6:
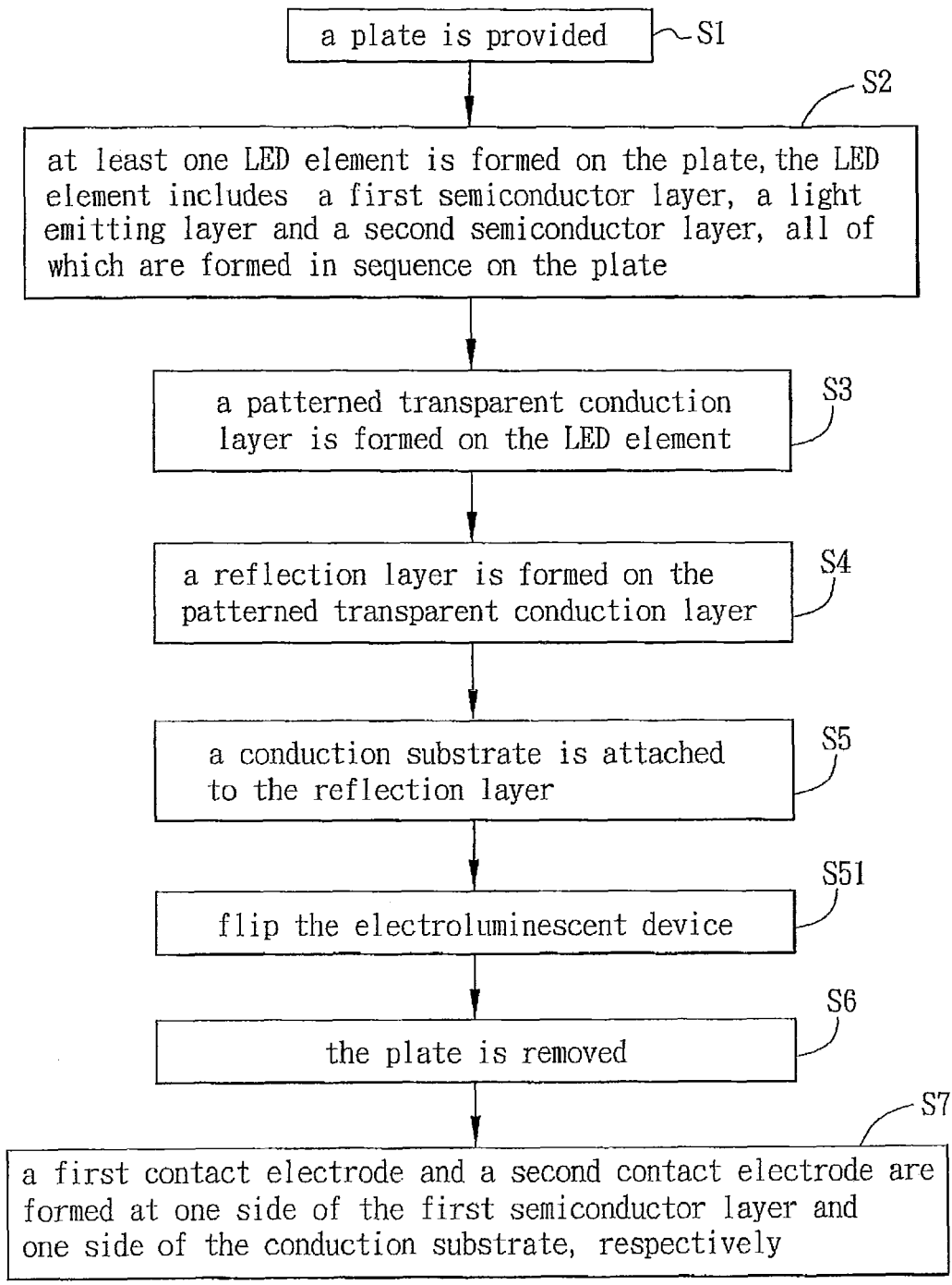
FIG. 6 is a flowchart showing a fabrication method of an electroluminescent device according to a preferred embodiment of the present invention.
Figure 7A:
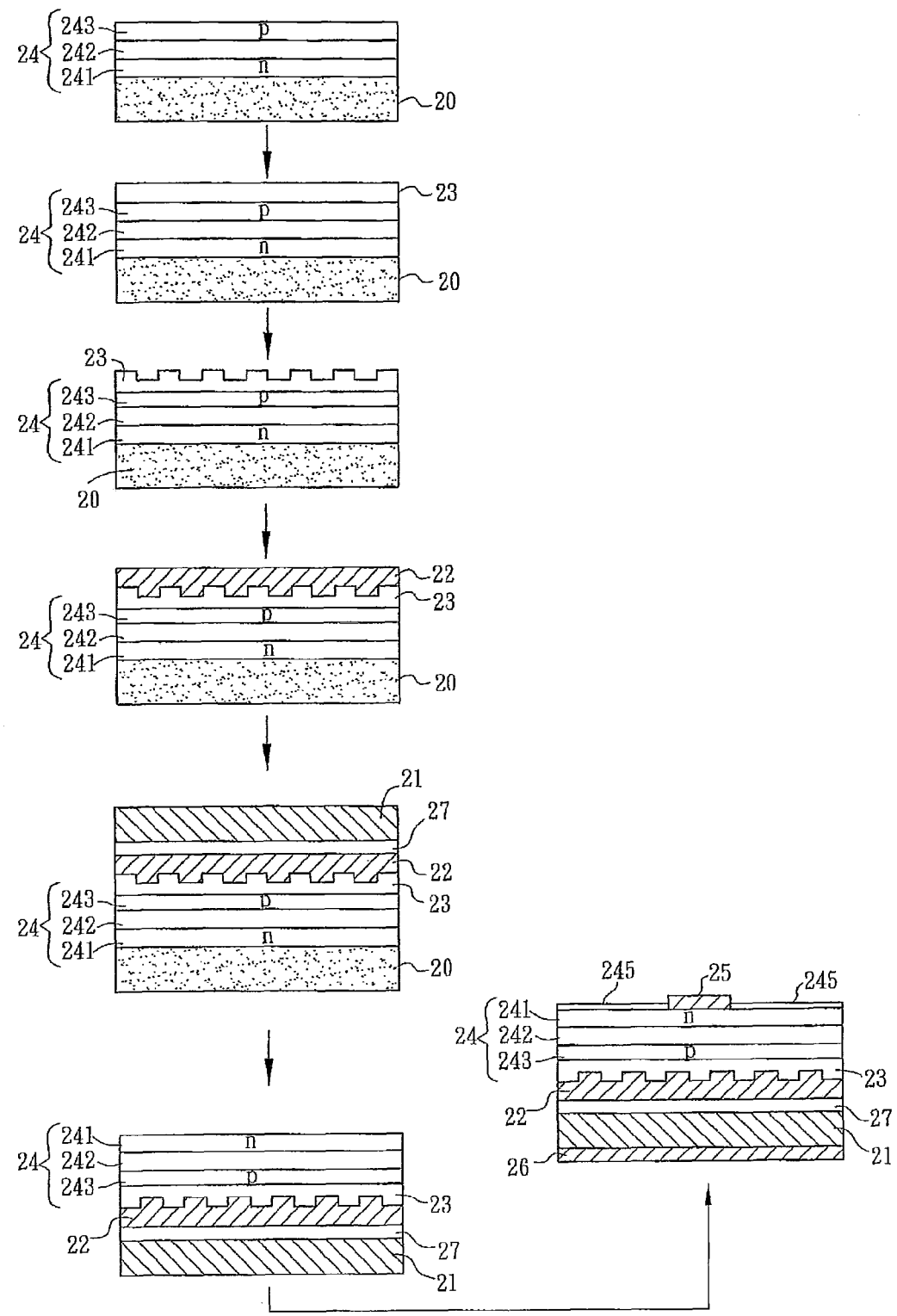
FIGS. 7A and 7B are schematic diagrams showing the steps in the fabrication method of the electroluminescent device according to the preferred embodiment of the present invention.
Figure 7B:
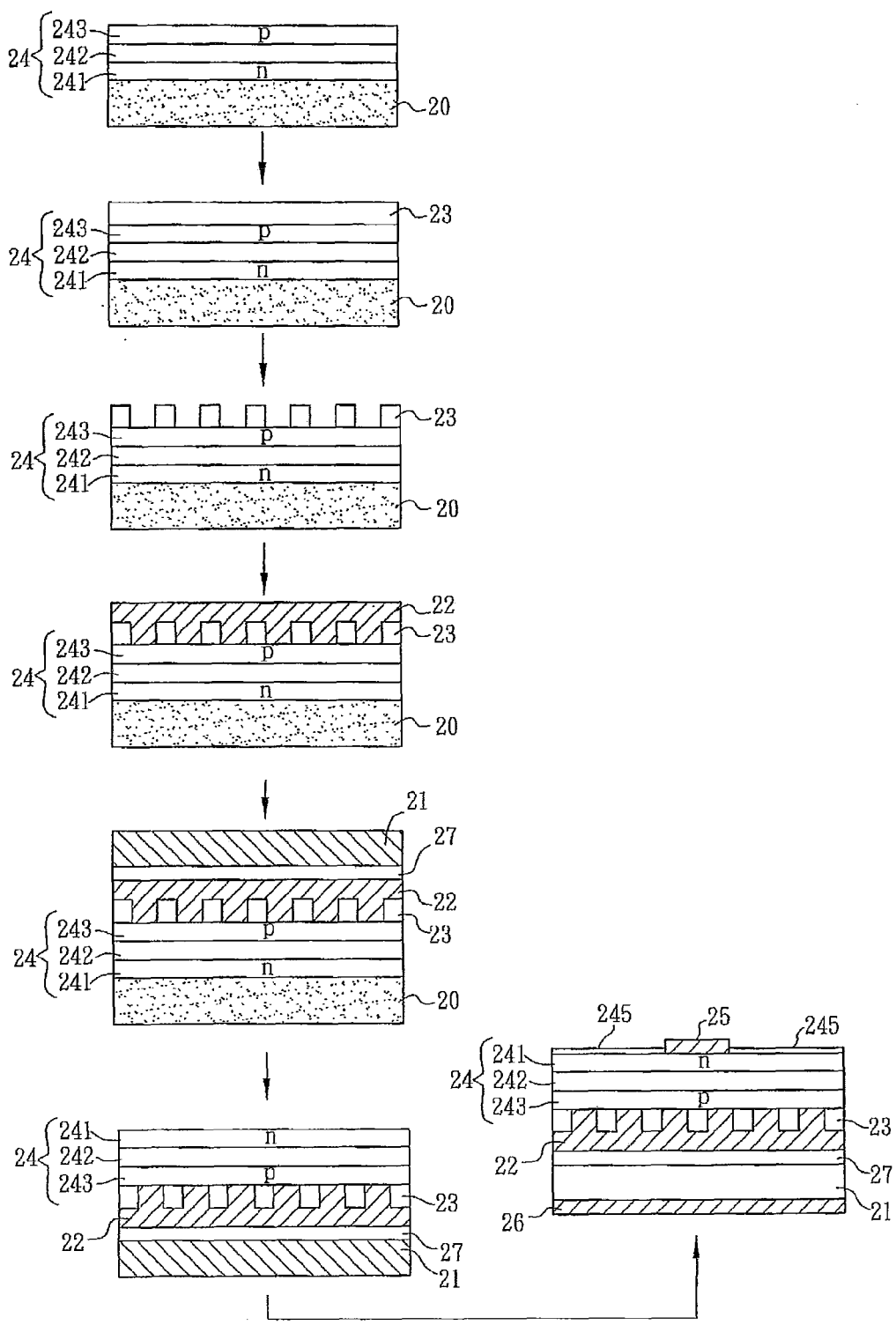

To further understand the contents of the electroluminescent device 2 according to the present invention, please refer to FIGS. 6, 7A and 7B. A fabrication method of the electroluminescent device includes the steps of S1 to S7. In step S1, a plate 20 is provided. In step S2, at least one LED element 24 is formed on the plate 20. The LED element 24 includes in sequence a first semiconductor layer 241, a light emitting layer 242, and a second semiconductor layer 243, with the first semiconductor layer 241 formed on the plate 20. In step S3, a patterned transparent conduction layer 23 is formed on the LED element 24. In step S4, a reflection layer 22 is formed on the patterned transparent conduction layer 23. In step S5, a conduction substrate 21 is attached to the reflection layer 22. In step S6, the plate 20 is removed. In step S7, a first contact electrode 25 and a second contact electrode 26 are formed at one side of the first semiconductor layer 241 and one side of the conduction substrate 21, respectively.

In step S1, the plate 20 is provided as a temporary substrate for making the LED element 24. The material of the plate 20 can be, for example aluminum oxide (e.g., $Al_2O_3$). After the plate 20 is appropriately cleaned, a subsequent process of growing the epitaxy layer of the LED element 24 is performed.

In step S2, the LED element 24 is formed on the plate 20. That is, the first semiconductor layer 241, the light emitting layer 242 and the second semiconductor layer 243 are disposed in sequence on the plate 20 to form the LED element 24. In this embodiment, the first semiconductor layer 241 can be an n-type semiconductor layer and the second semiconductor layer 243 can be a p-type semiconductor layer. However, this is only an example and the present invention is not restricted to this embodiment.

In step S3, the patterned transparent conduction layer 23 is formed on the LED element 24. In this embodiment, the material of the patterned transparent conduction layer 23 is selected from the group consisting of ITO, Cd—Sn oxide, Sb—Sn oxide, Be, Ge, Ni, Au and their combinations. It is formed on the second semiconductor layer 243 of the LED element 24 by deposition. Afterwards, it is patterned by photolithography and etching processes. The etching process can be either dry etching or wet etching, accompanied by physical and/or chemical etching. In this embodiment, the patterned transparent conduction layer 23 includes a plurality of island-like structures. By etching in different depths, such as etching stop at different depth, the patterned transparent conduction layer 23 can include continuous island-like structures (as shown in FIG. 7A). Alternatively, the etching can be performed until the entire patterned transparent conduction layer 23 is etched through and stops at the second semiconductor layer 243 of the LED element 24. The patterned transparent conduction layer 23 thus includes independent island-like structures (as shown in FIG. 7B). The cross section of the island-like structure is not restricted, that can be rectangular, circular, polygonal or irregular.

In step S4, the reflection layer 22 is formed on the patterned transparent conduction layer 23. In this embodiment, the material of the reflection layer 22, which having high reflectivity, is selected from the group consisting of Pt, Au, Ag, Pd, Ni, Cr. Ti, Al and their combinations. According to the patterned structure of the patterned transparent conduction layer 23, the reflection layer 22 thereon is uneven in surface such as ups and downs. Moreover, the reflection layer 22 forms an ohmic contact with the patterned transparent conduction layer 23, which enhancing the external light extraction and lowering the resistance. Thus, overall light emitting efficiency is effectively raised.

In step S5, the conduction substrate 21 is attached to the reflection layer 22. In this embodiment, the conduction substrate 21 is attached to the reflection layer 22 via an adhering layer 27. Here the adhering layer 27 can be applied on the reflection layer 22 or the conduction substrate 21 before the conduction substrate 21 is attached. The adhering layer 27 can cover parts of the reflection layer 22 or the entire surface of the reflection layer 22. The conduction substrate 21 and the adhering layer 27 are highly thermally conductive. The conduction substrate 21 is made of a semiconductor mater (such as Si, GaAs, GaP, SiC, BN or their combinations) or a metal, such as Al, Cu, Ag, Au, Ni or their combinations. The material of the adhering layer 27 is silver paste, tin paste, tin-silver paste, a eutectic bonding material, metal or a conductive adhering material which is a material containing lead or containing no lead.

Step S5 is followed by step S51. In step S51, the electroluminescent device is flipped for the subsequent step of removing the temporary substrate.

In step S6, the plate 20 is removed. That is, the temporary substrate for growing the LED element 24 is removed. In this embodiment, the step of flipping the electroluminescent device can be executed after step S6 as well.

In step S7, the first contact electrode 25 and the second contact electrode 26 are formed at the side of the first semiconductor layer 241 and the side of the conduction substrate 21 so as to form electrical connections with the first semiconductor layer 241 and the second semiconductor layer 243, respectively. When the first contact electrode 25 and the second contact electrode 26 are imposed with a voltage, the electrons and holes in the first semiconductor layer 241 and the second semiconductor layer 243 start to combine and release optical energy. Beside, a rough stricture, an anti-reflection layer 245 or a transparent conduction layer can be formed at the side of the first semiconductor layer 241 (i.e., the light-emitting surface) and on a position without the first contact electrode 25. This helps guiding the lights out.

In summary, an electroluminescent device and a fabrication method thereof according to the present invention utilize a conduction substrate that connects the contact electrodes of the LED element disposed at opposite sides of the conduction substrate. In comparison with the prior art, because the etching process is avoided, the production processes are thus simplified and the yield is raised. In addition, the patterned transparent conduction layer with a plurality of island-like structures is formed by for example the etching method so that the electrical current imposed to the LED element can be uniformly distributed so as to prevent current clogging. Moreover, the deposition of the reflection layer has a good ohmic contact with the patterned transparent conduction layer and provides a scattering and reflection interface. It effectively raises external light extraction and light emitting efficiency. Also, since the conduction substrate and the reflection layer are highly thermally conductive, the heat generated from the LED element can be more effectively dissipated than the prior art.

Although the present invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. An electroluminescent device, comprising:
   a conduction substrate;
   a reflection layer disposed on the conduction substrate, wherein the reflection layer is uneven in surface;
   a patterned transparent conduction layer formed on the reflection layer, wherein the patterned transparent conduction layer is filled with concave parts of the reflection layer;
   at least one light emitting diode (LED) element formed on the patterned transparent conduction layer, wherein the LED element comprises a first semiconductor layer, a light emitting layer and a second semiconductor layer in sequence, and the second semiconductor layer is located on the patterned transparent conduction layer and the reflection layer, wherein convex parts of the reflection layer are directly in contact with the second semiconductor layer;
   a first contact electrode disposed at one side of the first semiconductor layer; and
   a second contact electrode disposed at one side of the conduction substrate.

2. The electroluminescent device of claim 1, wherein the reflection layer is an ohmic contact metal layer, and the reflection layer comprises Pt, Au, Ag, Pd, Ni, Cr, Ti, Al or their combinations.

3. The electroluminescent device of claim 1, wherein the patterned transparent conduction layer comprises a plurality of island-like structures, the island-like structures are independent or continuous, and the island-like structure has a cross section with a rectangular, circular, polygonal or an irregular shape.

4. The electroluminescent device of claim 1, further comprising an adhering layer disposed between the reflection layer and the conduction substrate.

5. The electroluminescent device of claim 3, wherein the adhering layer serves as a bonding layer.

6. The electroluminescent device of claim 3, wherein the adhering layer comprises silver paste, tin paste, tin-silver paste, a eutectic bonding material, metal or a conductive adhering material, which is a material containing lead or containing no lead.

7. The electroluminescent device of claim 3, wherein the conduction substrate and the adhering layer have properties of high thermal conductivity, and the conduction substrate comprises a semiconductor material or a metal.

8. The electroluminescent device of claim 6, wherein the semiconductor material comprises Si, GaAs, GaP, SiC, BN or their combinations, and the metal comprises Al, Cu, Ag, Au, Ni or their combinations.

9. The electroluminescent device of claim 1, wherein a rough structure or an anti-reflection layer is formed on the side of the first semiconductor layer and at a position without the first contact electrode.

10. The electroluminescent device of claim 1, wherein a transparent conduction layer is formed at the side of the first semiconductor layer and on a position without the first contact electrode.

11. An electroluminescent device, comprising:
    a conduction substrate;
    a reflection layer disposed on the conduction substrate, wherein the reflection layer is uneven in surface;
    a patterned transparent conduction layer formed on the reflection layer, wherein the patterned transparent conduction layer is filled with concave parts of the reflection layer and has a flat surface;
    at least one light emitting diode (LED) element formed on the patterned transparent conduction layer, wherein the LED element comprises a first semiconductor layer, a light emitting layer and a second semiconductor layer in sequence, and the second semiconductor layer is located on the patterned transparent conduction layer and the reflection layer wherein the second semiconductor layer is directly in contact with the flat surface of the patterned transparent conduction layer;
    a first contact electrode disposed at one side of the first semiconductor layer; and
    a second contact electrode disposed at one side of the conduction substrate.

* * * * *